(12) United States Patent
Kim et al.

(10) Patent No.: US 8,524,851 B2
(45) Date of Patent: Sep. 3, 2013

(54) SILICON-BASED HARDMASK COMPOSITION AND PROCESS OF PRODUCING SEMICONDUCTOR INTEGRATED CIRCUIT DEVICE USING THE SAME

(75) Inventors: Sang Kyun Kim, Uiwang-si (KR); Hyeon Mo Cho, Uiwang-si (KR); Sang Ran Koh, Uiwang-si (KR); Mi Young Kim, Uiwang-si (KR); Hui Chan Yun, Uiwang-si (KR); Yong Jin Chung, Uiwang-si (KR); Jong Seob Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 381 days.

(21) Appl. No.: 12/805,081

(22) Filed: Jul. 12, 2010

(65) Prior Publication Data
US 2010/0279509 A1 Nov. 4, 2010

Related U.S. Application Data

(63) Continuation of application No. PCT/KR2008/007886, filed on Dec. 31, 2008.

(30) Foreign Application Priority Data

Jan. 11, 2008 (KR) ........................ 10-2008-0003676

(51) Int. Cl.
*C08G 77/60* (2006.01)
(52) U.S. Cl.
USPC .............. 528/35; 430/311; 430/314; 430/322
(58) Field of Classification Search
USPC ............................ 528/35; 430/311, 314, 322
See application file for complete search history.

(56) References Cited

U.S. PATENT DOCUMENTS

| | | | |
|---|---|---|---|
| 7,659,357 B2 | 2/2010 | Nakata et al. | |
| 2002/0142586 A1 | 10/2002 | Shiota | |
| 2005/0031791 A1* | 2/2005 | Sasaki et al. | 427/372.2 |
| 2006/0014842 A1* | 1/2006 | Li et al. | 521/61 |
| 2006/0069171 A1* | 3/2006 | Prokopowicz et al. | 521/61 |
| 2007/0026689 A1* | 2/2007 | Nakata et al. | 438/781 |
| 2007/0148974 A1 | 6/2007 | Uh et al. | |
| 2007/0154839 A1 | 7/2007 | Jung | |
| 2007/0224816 A1 | 9/2007 | Uh et al. | |
| 2008/0118875 A1 | 5/2008 | Kim et al. | |
| 2008/0237615 A1* | 10/2008 | Lee et al. | 257/89 |
| 2010/0297539 A1 | 11/2010 | Gronbeck et al. | |

FOREIGN PATENT DOCUMENTS

| | | |
|---|---|---|
| CN | 1671772 A | 9/2005 |
| JP | 2007/086773 A | 4/2007 |
| JP | 2007/193308 A | 8/2007 |
| JP | 2007/258683 A | 10/2007 |
| KR | 10-2002-0077174 A | 10/2002 |
| KR | 10-2007-0006534 A | 1/2007 |
| KR | 10-2007-0122250 A | 12/2007 |
| TW | I250584 | 3/2006 |
| WO | WO 2004/037877 A2 | 5/2004 |
| WO | WO 2007/074961 A1 | 7/2007 |
| WO | WO 2008/063016 A1 | 5/2008 |

OTHER PUBLICATIONS

European Search Report in EP 08869469.0-1226/2229607, dated Dec. 20, 2011 (Kim, et al.).
Chinese Search Report in CN 2008801244896, dated Mar. 25, 2013 (Kim, et al.).

* cited by examiner

*Primary Examiner* — Margaret Moore
(74) *Attorney, Agent, or Firm* — Lee & Morse, P.C.

(57) ABSTRACT

A silicon-based hardmask composition, including an organosilane polymer represented by Formula 1:

$$\{(SiO_{1.5}-Y-SiO_{1.5})_x(R_3SiO_{1.5})_y(XSiO_{1.5})_z\}(OH)_e(OR_6)_f \quad (1).$$

15 Claims, 3 Drawing Sheets

SILICON-BASED HARDMASK COMPOSITION AND PROCESS OF PRODUCING SEMICONDUCTOR INTEGRATED CIRCUIT DEVICE USING THE SAME

CROSS-REFERENCE TO RELATED APPLICATION

This application is a continuation of pending International Application No. PCT/KR2008/007886, entitled "Silicon-Based Hardmask Composition and Process of Producing Semiconductor Integrated Circuit Device Using the Same," which was filed on Dec. 31, 2008 the entire contents of which are hereby incorporated by reference for all purposes.

BACKGROUND

1. Field

Embodiments relate to a silicon-based hardmask composition and a process of producing a semiconductor integrated circuit device using the same.

2. Description of the Related Art

With decreasing width of lines used in semiconductor microcircuits, the use of photoresists with smaller thickness is required due to the aspect ratio of the patterns. However, too thin a photoresist suffers from difficulty in performing a role as a mask in a subsequent pattern transfer (i.e. etching) process. That is, since the thin photoresist is liable to be worn out during etching, an underlying substrate cannot be etched to a desired depth. To solve these problems, hardmask processes have been introduced.

SUMMARY

It is a feature of an embodiment to provide a silicon-based spin-on hardmask composition that has high etch selectivity and good storage stability and whose surface physical properties can be modified.

It is another feature of an embodiment to provide a process for producing a semiconductor integrated circuit device using the silicon-based hardmask composition.

At least one of the above and other features and advantages may be realized by providing a silicon-based hardmask composition, including an organosilane polymer represented by Formula 1:

$$\{(SiO_{1.5}\text{—}Y\text{—}SiO_{1.5})_x(R_3SiO_{1.5})_y(XSiO_{1.5})_z\}(OH)_e(OR_6)_f \quad (1),$$

wherein:

x, y, and z satisfy the relations $0.05 \leq x \leq 0.9$, $0.05 \leq y \leq 0.9$, $0 \leq z \leq 0.9$, and $x+y+z=1$, e and f represent the ratios of the numbers of terminal —OH groups and —OR$_6$ groups bonded to the silicon atoms to the number of 2x+y+z silicon atoms in the organosilane polymer, respectively, and satisfy the relations $0.03 \leq e \leq 0.2$ and $0.03 \leq f \leq 0.25$, X is a $C_6$-$C_{30}$ group containing at least one substituted or unsubstituted aromatic ring, $R_3$ is a $C_1$-$C_{12}$ alkyl group, Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond, and $R_6$ is a $C_1$-$C_6$ alkyl group.

The organosilane polymer may be a polycondensate of compounds represented by Formulae 2, 3, and 4:

$$(HO)_a(R_1O)_{(3-a)}Si\text{—}X \quad (2)$$

wherein $R_1$ is a $C_1$-$C_6$ alkyl group, $0 \leq a \leq 3$, and X is a $C_6$-$C_{30}$ group containing at least one substituted or unsubstituted aromatic ring;

$$(HO)_b(R_2O)_{(3-b)}Si\text{—}R_3 \quad (3)$$

wherein $R_2$ is a $C_1$-$C_6$ alkyl group, $0 \leq b \leq 3$, and $R_3$ is a $C_1$-$C_{12}$ alkyl group; and $$(HO)_c(R_4O)_{(3-c)}Si\text{—}Y\text{—}Si(OH)_d(R_5O)_{(3-d)} \quad (4)$$

wherein $R_4$ and $R_5$ are independently a $C_1$-$C_6$ alkyl group, $0 \leq c \leq 3$, $0 \leq d \leq 3$, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond.

The organosilane polymer may have a weight average molecular weight of about 2,000 to about 90,000.

The organosilane polymer may be prepared by polycondensation, in the presence of an acid catalyst, of hydrolysates of compounds represented by Formulae 5, 6, and 7:

$$(R_1O)_3Si\text{—}X \quad (5)$$

wherein X is a $C_6$-$C_{30}$ group containing at least one substituted or unsubstituted aromatic ring, and $R_1$ is a $C_1$-$C_6$ alkyl group;

$$(R_2O)_3Si\text{—}R_3 \quad (6)$$

wherein $R_2$ is a $C_1$-$C_6$ alkyl group and $R_3$ is a $C_1$-$C_{12}$ alkyl group; and $$(R_4O)_3Si\text{—}Y\text{—}Si(OR_5)_3 \quad (7)$$

wherein $R_4$ and $R_5$ are independently a $C_1$-$C_6$ alkyl group, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone and a $C_2$-$C_{20}$ hydrocarbon group containing at least one multiple bond.

The organosilane polymer may be prepared by mixing up to about 90 parts by weight of the compound represented by Formula 5, about 5 to about 90 parts by weight of the compound represented by Formula 6, and about 5 to about 90 parts by weight of the compound represented by Formula 7 with respect to 100 parts by weight of the compounds represented by Formulae 5, 6, and 7, and allowing the mixture to react in the presence of about 0.001 to about 5 parts by weight of an acid catalyst.

The acid catalyst may be selected from the group of nitric acid, sulfuric acid, hydrochloric acid, p-toluenesulfonic acid monohydrate, diethyl sulfate, and combinations thereof.

The organosilane polymer may be prepared by polycondensation of hydrolysates of compounds represented by Formulae 6 and 7:

$$(R_2O)_3Si\text{—}R_3 \quad (6)$$

wherein $R_2$ is a $C_1$-$C_6$ alkyl group and $R_3$ is a $C_1$-$C_{12}$ alkyl group; and $$(R_4O)_3Si\text{—}Y\text{—}Si(OR_5)_3 \quad (7)$$

wherein $R_4$ and $R_5$ are independently a $C_1$-$C_6$ alkyl group, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone and a $C_2$-$C_{20}$ hydrocarbon group containing at least one multiple bond, in the presence of an acid catalyst.

The hardmask composition may further include a solvent, and the organosilane polymer may be present in an amount of about 1 to about 50 parts by weight, based on 100 parts by weight of the hardmask composition.

The hardmask composition may further include at least one additive selected from the group of crosslinkers, radical stabilizers, and surfactants.

The hardmask composition may further include at least one compound selected from the group of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, tetrabutylammonium nitrate, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluenesulfonate, and tetrabutylammonium phosphate.

The hardmask composition may further include at least one additive selected from the group of crosslinkers, radical stabilizers, and surfactants.

The organosilane polymer represented by Formula 1 may be represented by the following Formula 1A:

(1A), wherein f1 and f2 satisfy the relation f1+f2=f.

At least one of the above and other features and advantages may also be realized by providing a process for producing a semiconductor integrated circuit device, the process including forming a carbon-based hardmask layer on a substrate; coating the hardmask composition according to claim 1 on the carbon-based hardmask layer to form a silicon-based hardmask layer; patterning a photoresist layer on the silicon-based hardmask layer to form a pattern; transferring the pattern to the silicon-based hardmask layer using the patterned photoresist layer as an etch mask to pattern the silicon-based hardmask layer; transferring the pattern to the carbon-based hardmask layer using the patterned silicon-based hardmask layer as an etch mask to pattern the carbon-based hardmask layer; and transferring the pattern to the substrate using the patterned carbon-based hardmask layer as an etch mask.

The process may further include forming an antireflective coating on the silicon-based hardmask layer prior to forming the photoresist layer on the silicon-based hardmask layer.

Coating the hardmask composition may be performed using a spin-on process.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2008-0003676, filed on Jan. 11, 2008 in the Korean Intellectual Property Office, and entitled: "Silicon-Based Hardmask Composition and Process of Producing Semiconductor Integrated Circuit Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Herein, Markush groups, if any, are identified by the closed language "selected from the group consisting of."

According to an embodiment, there is provided a silicon-based hardmask composition that may be applied by spin-on coating (hereinafter, also referred to a 'silicon-based spin-on hardmask composition'). According to an embodiment, there is also provided a process for producing a semiconductor integrated circuit device using the hardmask composition. According to an embodiment, there is also provided a semiconductor integrated circuit produced using the process.

According to an embodiment, there is provided a silicon-based spin-on hardmask composition that includes a polysilsesquioxane, as a base resin, having terminal hydroxyl (—OH) and alkoxy (—OR) groups and containing linkers connecting two adjacent silicon atoms. The hardmask composition according to an embodiment may exhibit good storage stability and may be used for the production of a hardmask with good etch resistance to $O_2$ plasma gas during etching. The hardmask produced using the hardmask composition may easily transfer a pattern despite being formed to a very small thickness. In addition, the surface hydrophilicity of the hardmask may be modified so that the compatibility of the hardmask with overlying and underlying films can be improved. Furthermore, the hardmask may assist in accurately forming a photoresist pattern during exposure in semiconductor manufacturing processes due to its ability to absorb light.

Particularly, high etch selectivity of the hardmask may facilitate the transfer of a pattern of a thin photoresist layer to a desired substrate through the hardmask. Moreover, the hardmask surface physical properties may be modified so as to be easily coated with a thin photoresist or an anti-reflective coating (ARC).

An embodiment provides a silicon-based hardmask composition including (a) an organosilane polymer represented by Formula 1:

$$\{(SiO_{1.5}-Y-SiO_{1.5})_x(R_3SiO_{1.5})_y(XSiO_{1.5})_z\}(OH)_e(OR_6)_f \quad (1)$$

In Formula 1, x, y, and z represent the relative ratios of the repeating units $(SiO_{1.5}-Y-SiO_{1.5})$, $(R_3SiO_{1.5})$, and $(XSiO_{1.5})$ in the polymer, and may satisfy the relations $0.05 \leq x \leq 0.9$, $0.05 \leq y \leq 0.9$, $0 \leq z \leq 0.9$, and $x+y+z=1$. In Formula 1, e and f represent the ratios of the numbers of the terminal —OH groups and —OR groups bonded to the silicon (Si) atoms to the number of the 2x+y+z silicon (Si) atoms in the polymer, respectively, and may satisfy the relations $0.03 \leq e \leq 0.2$ and $0.03 \leq f \leq 0.25$. In Formula 1, X may be a $C_6$-$C_{30}$ functional group containing at least one substituted or unsubstituted aromatic ring. In Formula 1, $R_3$ may be a $C_1$-$C_{12}$ alkyl group. In another implementation, $R_3$ may be a $C_1$-$C_6$ alkyl group. In Formula 1, Y is a linking group, and the linking group may be selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond. In Formula 1, $R_6$ may be a $C_1$-$C_6$ alkyl group. Herein, it will be understood that alkoxy groups —$OR_6$ may be the same or different. In an implementation, the organosilane polymer may be a random copolymer.

In an implementation, the organosilane polymer represented by Formula 1 may be represented by the following Formula 1A:

$$\{(SiO_{1.5}-CH_2CH_2-SiO_{1.5})_x(MeSiO_{1.5})_y(PhSiO_{1.5})_z\}(OH)_e(OMe)_{f1}(OEt)_{f2} \quad (1A),$$

wherein f1 and f2 satisfy the relation f1+f2=f.

The hardmask composition may further include (b) a solvent.

The organosilane polymer (a) may be a polycondensate of compounds represented by Formulae 2, 3, and 4:

$$(HO)_a(R_1O)_{(3-a)}Si-X \quad (2)$$

wherein $R_1$ may be a $C_1$-$C_6$ alkyl group, a may satisfy $0 \leq a \leq 3$, and X may be a $C_6$-$C_{30}$ functional group containing at least one substituted or unsubstituted aromatic ring;

$$(HO)_b(R_2O)_{(3-b)}Si-R_3 \quad (3)$$

wherein $R_2$ may be a $C_1$-$C_6$ alkyl group, b may satisfy $0 \leq b \leq 3$, and $R_3$ may be a $C_1$-$C_{12}$ alkyl group; and $$(HO)_c(R_4O)_{(3-c)}Si-Y-Si(OH)_d(R_5O)_{(3-d)} \quad (4)$$

wherein $R_4$ and $R_5$ may be independently a $C_1$-$C_6$ alkyl group, c and d may satisfy $0 \leq c \leq 3$, $0 \leq d \leq 3$, and Y is a linking group that may be selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond.

The organosilane polymer (a) may be prepared by polycondensation of hydrolysates of compounds represented by Formulae 5, 6, and 7:

$$(R_1O)_3Si-X \quad (5)$$

wherein X may be a $C_6$-$C_{30}$ functional group containing at least one substituted or unsubstituted aromatic ring, and $R_1$ may be a $C_1$-$C_6$ alkyl group;

$$(R_2O)_3Si-R_3 \quad (6)$$

wherein $R_2$ may be a $C_1$-$C_6$ alkyl group and $R_3$ may be a $C_1$-$C_{12}$ alkyl group; and $$(R_4O)_3Si-Y-Si(OR_5)_3 \quad (7)$$

wherein $R_4$ and $R_5$ may be independently a $C_1$-$C_6$ alkyl group, and Y is a linking group that may be selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone and a $C_2$-$C_{20}$ hydrocarbon group containing at least one multiple bond, in the presence of an acid catalyst.

The organosilane polymer (a) may have a weight average molecular weight of about 2,000 to about 90,000.

Figure 2:
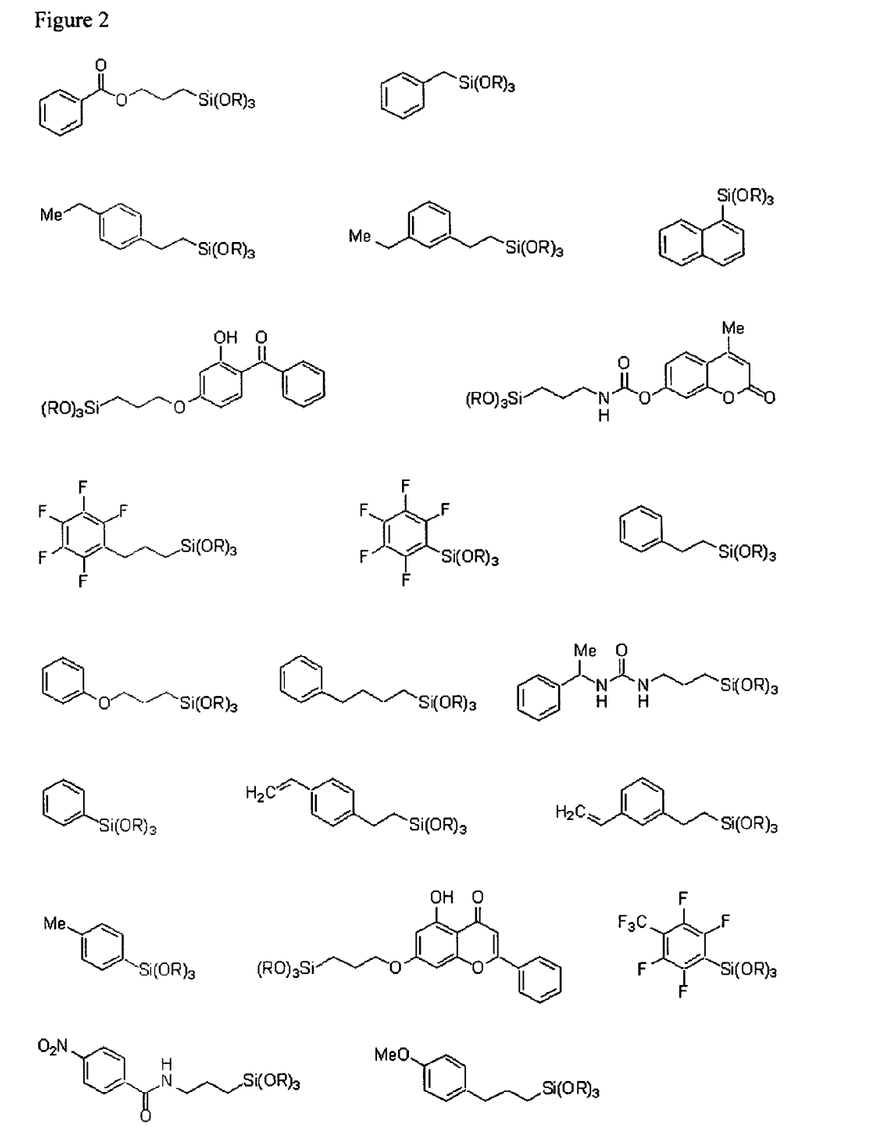
FIG. 2 illustrates specific example compounds represented by Formula 5.
Figure 3:
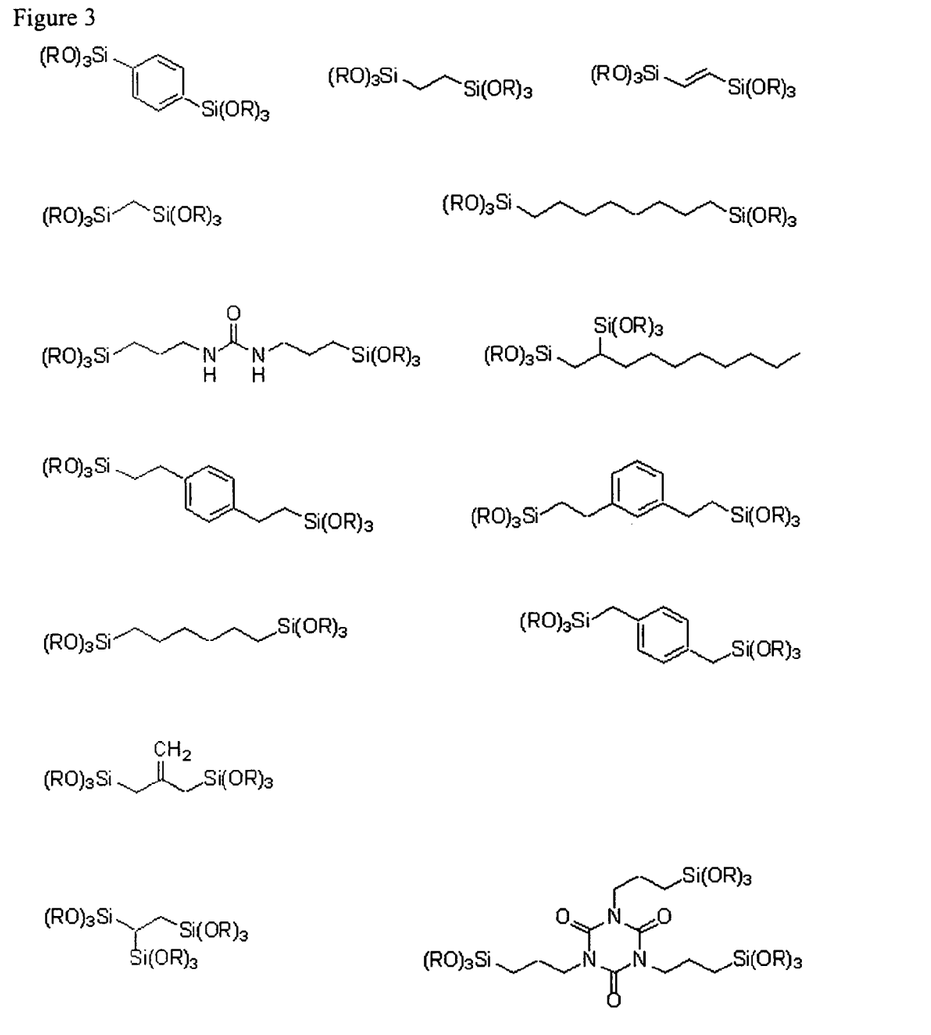
FIG. 3 illustrates specific example compounds represented by Formula 7.

Specific examples of the compounds represented by Formulae 5 and 7 are shown in FIGS. 2 and 3, respectively (in FIGS. 2 and 3, Me=methyl, R=$C_1$-$C_6$ alkyl).

The organosilane polymer may be prepared by mixing 0 to about 90 parts by weight of the compound represented by Formula 5 (where 0 parts by weight indicates that the compound represented by Formula 5 may be omitted, as described in detail below), about 5 to about 90 parts by weight of the compound represented by Formula 6 and about 5 to about 90 parts by weight of the compound represented by Formula 7 with respect to 100 parts by weight of the compounds represented by Formulae 5, 6, and 7, and allowing the mixture to react in the presence of about 0.001 to about 5 parts by weight of an acid catalyst in about 100 to about 900 parts by weight of a reaction solvent.

The acid catalyst may be selected from the group of nitric acid, sulfuric acid, hydrochloric acid, p-toluenesulfonic acid monohydrate, diethyl sulfate, and combinations thereof.

The hydrolysis or condensation reaction may be suitably controlled by varying the kind, the amount, and the addition mode of the acid catalyst. The acid catalyst may be used in an amount of about 0.001 and about 5 parts by weight. The use of the acid catalyst in an amount smaller than about 0.001 parts by weight may slow down the reaction rates, while the use of the acid catalyst in an amount larger than about 5 parts by weight may cause an increase in the reaction rates and thereby make it difficult to prepare a polycondensation product having a desired molecular weight.

The reaction solvent may be selected from the group of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, γ-butyrolactone, and mixtures thereof.

The compounds represented by Formulae 2, 3, and 4 may be prepared by hydrolysis of the compounds represented by Formulae 5, 6, and 7, respectively, in the presence of the acid catalyst.

Taking advantage of the ability of the substituted or unsubstituted aromatic group included in the compound represented by Formula 5 to absorb UV light in the deep UV (DUV) region, the hardmask composition of the present embodiment may exhibit excellent antireflective properties. The hardmask composition of the present embodiment may have desired absorbance and refractive index at a particular wavelength by controlling the number of the substituted or unsubstituted aromatic groups in the organosilane polymer.

It is preferable to use the compound represented by Formula 5 in an amount of 0 to about 90 parts by weight, based on 100 parts by weight of the compounds represented by Formulae 5, 6, and 7. When the compound represented by Formula 5 is used in an amount of less than about 90 parts by weight, the antireflective properties of the hardmask composition may be very satisfactory due to the substituted or unsubstituted aromatic groups, thus avoiding the need to apply an additional antireflective coating. For the purpose of achieving improved absorbance and photo profile of the hardmask composition, an antireflective coating may be additionally used. If the compound represented by Formula 5 is not used (i.e. 0 parts by weight), an additional antireflective coating may be used if necessary. Meanwhile, if the compound represented by Formula 5 is used in an amount exceeding about 90 parts by weight, sufficient etch selectivity of the hardmask composition may not be ensured due to the decreased Si content. Suitable antireflective properties may be attained by controlling the relative amount of the compound represented by Formula 5.

On the other hand, an increase in the relative amount of the compound represented by Formula 6 used may provide better storage stability of the hardmask composition. It is preferred to use the compound represented by Formula 6 in an amount of about 5 to about 90 parts by weight, based on 100 parts by weight of the compounds represented by Formulae 5, 6, and 7. If the compound represented by Formula 6 is used in an amount of less than about 5 parts by weight, the storage stability of the hardmask composition may be impaired. Meanwhile, if the compound represented by Formula 6 is used in an amount of more than about 90 parts by weight, the absorbance of the hardmask composition may be lowered.

An increase in the relative content of the compound represented by Formula 7 may provide an improvement in the hydrophilicity of the hardmask composition. It is preferred to use the compound represented by Formula 7 in an amount of about 5 to about 90 parts by weight, based on 100 parts by weight of the compounds represented by Formulae 5, 6, and 7. The use of the compound represented by Formula 7 in an amount of less than about 5 parts by weight may not provide a desirable level of modification of hydrophilicity. Meanwhile, the use of the compound represented by Formula 7 in an amount exceeding about 90 parts by weight may cause a deterioration in the storage stability of the hardmask composition. An increase in the relative amount of the compound represented by Formula 7 may reduce the degree of freedom of the bonds due to the linkers present between the Si atoms, and thus increase the number of the Si—OH groups exposed to the surface, which may render a thin film formed using the hardmask composition highly hydrophilic. Consequently, the hydrophilicity of the hardmask may be controlled by varying the amount of the compound represented by Formula 7. The hydrophilicity of the hardmask is an important factor in controlling the compatibility with a film overlying the hardmask.

The storage stability of the hardmask composition may be enhance by varying the amount of the alkoxy groups in the final polycondensate, which is prepared by polycondensation of hydrolysates of the compounds represented by Formulae 5, 6, and 7. Preferably, the amount of the alkoxy groups in the organosilane polymer is controlled to a maximum of about 25 mol % relative to the repeating units of the polymer. An increase in the amount of the alkoxy groups brings about an improvement in storage stability but may cause poor coatability and solvent resistance, which may render the quality of the coating non-uniform or make it difficult to coat another film on the hardmask.

The organosilane polymer (a) is preferably present in an amount of about 1 to about 50 parts by weight, and more preferably about 1 to about 30 parts by weight, based on 100 parts by weight of the hardmask composition. Out of this range, poor coatability of the hardmask composition may be caused.

Examples of solvents suitable for use in the hardmask composition of the present embodiment include acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate (PGMEA), propylene glycol ethyl ether acetate, propylene glycol propyl ether acetate, ethyl lactate, and γ-butyrolactone. The solvent may be the same as or different from the reaction solvent.

The hardmask composition of the present embodiment may further include a crosslinking catalyst selected from the group of sulfonic acid salts of organic bases, such as pyridinium p-toluenesulfonate, amidosulfobetain-16, and (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, tetrabutylammonium nitrate, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluenesulfonate, tetrabutylammonium phosphate, and mixtures thereof. The crosslinking catalyst plays a role in promoting the crosslinking of the organosilane polymer to improve the etch resistance and solvent resistance of the hardmask. The crosslinking catalyst is preferably used in an amount of about 0.0001 to about 0.01 parts by weight, based on 100 parts by weight of the organosilane polymer. The above effects may not be sufficient if the crosslinking catalyst is used in an amount of less than about 0.0001 parts by weight. The storage stability of the hardmask composition may be deteriorated if the crosslinking catalyst is used in an amount of more than about 0.01 parts by weight.

The hardmask composition of the present embodiment may further include at least one additive selected from crosslinkers, radical stabilizers, and surfactants. A combination of the additive and the crosslinking catalyst may be used in the hardmask composition of the present embodiment.

An embodiment provides a process for producing a semiconductor integrated circuit device using the hardmask composition. An example process according to an embodiment may include (a) forming a carbon-based hardmask layer on a substrate, (b) coating the hardmask composition on the carbon-based hardmask layer to form a silicon-based hardmask layer, (c) forming a photoresist layer on the silicon-based hardmask layer, (d) patterning exposing portions of the photoresist layer to light from a light source through a mask, (e) selectively removing portions of the photoresist layer to form a pattern, (f) transferring the pattern to the silicon-based hardmask layer using the patterned photoresist layer as an etch mask to pattern the silicon-based hardmask layer, (g) transferring the pattern to the carbon-based hardmask layer using the patterned silicon-based hardmask layer as an etch mask to pattern the carbon-based hardmask layer, and (h) transferring the pattern to the substrate using the patterned carbon-based hardmask layer as an etch mask. Patterning the photoresist layer may include exposing portions of the photoresist layer to light from a light source through a mask, and selectively removing the exposed portions of the photoresist layer to form a pattern. However, positive or negative photoresists may be used.

The process of the present embodiment may further include forming an antireflective coating on the silicon-based hardmask layer prior to step (c).

The process of the present embodiment may be carried out in accordance with the following procedure. First, a material (e.g., aluminum or silicon nitride (SiN)) to be patterned may be applied to a silicon substrate by any suitable technique. The material may be any one of electrically conductive, semi-conductive, magnetic, and insulating materials.

Subsequently, a carbon-based hardmask composition may be spin-coated to a thickness of, e.g., 500 to 4,000 Å and baked at, e.g., 100-300° C. for, e.g., 10 seconds to 10 minutes to form a carbon-based hardmask layer. Then, the hardmask composition according to an embodiment may be spin-coated to a thickness of, e.g., 500 to 4,000 Å on the carbon-based hardmask layer and baked at, e.g., 100-300° C. for, e.g., 10 seconds to 10 minutes to form a silicon-based hardmask layer. If needed, an antireflective coating (BARC) may be formed on the silicon-based hardmask layer.

A radiation-sensitive imaging layer (a photoresist layer) may be formed on the silicon-based hardmask layer. Exposure and development may be performed to form a pattern on the imaging layer. The exposed portions of the underlying layer may be dry-etched using a gas mixture, e.g., $CHF_3/CF_4$, to form a pattern on the silicon-based hardmask layer. After the dry etching, the exposed portions of the carbon-based hardmask layer may be etched using a gas mixture, e.g., $BCl_3/Cl_2$, to pattern the carbon-based hardmask layer.

The exposed potions of the material layer may be dry-etched using a gas mixture, e.g., $CHF_3/CF_4$, to pattern the material layer. A plasma (e.g., oxygen plasma) may be used to remove the remaining material, leaving the patterned material layer only. The process of the present embodiment may be applied to the fabrication of a semiconductor integrated circuit device.

The composition of the present embodiment and the resulting lithographic structure may be used in the fabrication and design of integrated circuit devices. For example, the composition of the present embodiment may be used in the formation of patterned material layer structures, such as metal wirings, holes for contacts and biases, insulating sections (e.g., damascene trenches (DTs) and shallow trench isolation (STI)), and trenches for capacitor structures. It should be appreciated that the present embodiment is not restricted to any particular lithographic techniques and device structures.

Hereinafter, the embodiments will be explained in more detail with reference to the following examples. However, these examples are given for the purpose of illustration only and are not to be construed as limiting the scope of the invention.

EXAMPLES

Example 1

449.8 g of methyltrimethoxysilane, 41.8 g of phenyltrimethoxysilane and 138.4 g of bis(triethoxysilyl)ethane were dissolved in 1,470 g of propylene glycol monomethyl ether acetate (PGMEA) in a 3-liter four-neck flask equipped with a mechanical agitator, a condenser, a dropping funnel, and a nitrogen inlet tube. To the solution was added 162.5 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 5 days while maintaining the reaction temperature at 80° C., yielding the silicone polymer represented by Formula 8:
$\{(SiO_{1.5}-CH_2CH_2-SiO_{1.5})_{0.10}(MeSiO_{1.5})_{0.846}$
$(PhSiO_{1.5})_{0.054}\}(OH)_{0.05}(OMe)_{0.15}(OEt)_{0.07}$ (8) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 2

265.4 g of methyltrimethoxysilane, 28.9 g of phenyltrimethoxysilane and 325.8 g of bis(triethoxysilyl)ethane were dissolved in 1,470 g of propylene glycol monomethyl ether acetate (PGMEA) in a 3-liter four-neck flask equipped with a mechanical agitator, a condenser, a dropping funnel, and a nitrogen inlet tube. To the solution was added 150.7 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 7 days while maintaining the reaction temperature at 50° C., yielding the silicone polymer represented by Formula 9:
$\{(SiO_{1.5}-CH_2CH_2-SiO_{1.5})_{0.30}(MeSiO_{1.5})_{0.636}$
$(PhSiO_{1.5})_{0.064}\}(OH)_{0.06}(OMe)_{0.13}(OEt)_{0.09}$ (9) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 3

146.2 g of methyltrimethoxysilane, 37.0 g of phenyltrimethoxysilane and 446.8 g of bis(triethoxysilyl)ethane were dissolved in 1,470 g of propylene glycol monomethyl ether acetate (PGMEA) in a 3-liter four-neck flask equipped with a mechanical agitator, a condenser, a dropping funnel, and a nitrogen inlet tube. To the solution was added 143.0 g of an aqueous nitric acid solution (1,000 ppm) at room temperature. After, the mixture was allowed to react at 50° C. for 1 hour, methanol and ethanol were removed from the reaction mixture under reduced pressure. The reaction was continued for 3 days while maintaining the reaction temperature at 50° C., yielding the silicone polymer represented by Formula 10:
$\{(SiO_{1.5}-CH_2CH_2-SiO_{1.5})_{0.50}(MeSiO_{1.5})_{0.426}$
$(PhSiO_{1.5})_{0.074}\}(OH)_{0.04}(OMe)_{0.10}(OEt)_{0.12}$ (10) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 4

271.4 g of methyltrimethoxysilane, 58.5 g of phenyltrimethoxysilane and 90.1 g of bis(triethoxysilyl)ethane were dissolved in 980 g of propylene glycol monomethyl ether acetate (PGMEA) in a 2-liter four-neck flask equipped with a mechanical agitator, a condenser, a dropping funnel, and a nitrogen inlet tube. To the solution was added 105.8 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 13 days while maintaining the reaction temperature at 80° C., yielding the silicone polymer represented by Formula 11:
$\{(SiO_{1.5}-CH_2CH_2-SiO_{1.5})_{0.10}(MeSiO_{1.5})_{0.784}(PhSiO_{1.5})_{0.116}\}(OH)_{0.06}(OMe)_{0.18}(OEt)_{0.03}$ (11) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 5

136.4 g of methyltrimethoxysilane, 49.7 g of phenyltrimethoxysilane and 444.0 g of bis(triethoxysilyl)ethane were dissolved in 1,470 g of propylene glycol monomethyl ether acetate (PGMEA) in a 3-liter four-neck flask equipped with a mechanical agitator, a condenser, a dropping funnel, and a nitrogen inlet tube. To the solution was added 142.1 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 7 days while maintaining the reaction temperature at 50° C., yielding the silicone polymer represented by Formula 12:
$\{(SiO_{1.5}-CH_2CH_2-SiO_{1.5})_{0.50}(MeSiO_{1.5})_{0.40}(PhSiO_{1.5})_{0.10}\}(OH)_{0.06}(OMe)_{0.11}(OEt)_{0.11}$ (12) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 6

170.5 g of methyltrimethoxysilane, 63.8 g of phenyltrimethoxysilane and 570.8 g of bis(triethoxysilyl)ethane were dissolved in 1,890 g of propylene glycol monomethyl ether acetate (PGMEA) in a 4-liter four-neck flask equipped with a mechanical agitator, a condenser, a dropping funnel, and a nitrogen inlet tube. To the solution was added 260.1 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 2 days while maintaining the reaction temperature at 50° C., yielding the silicone polymer represented by Formula 13:
$\{(SiO_{1.5}-CH_2CH_2-SiO_{1.5})_{0.50}(MeSiO_{1.5})_{0.040}(PhSiO_{1.5})_{0.10}\}(OH)_{0.11}(OMe)_{0.08}(OEt)_{0.06}$ (13) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Example 7

160.2 g of methyltrimethoxysilane, 59.1 g of phenyltrimethoxysilane and 528.5 g of bis(triethoxysilyl)ethane were dissolved in 1,750 g of propylene glycol monomethyl ether acetate (PGMEA) in a 4-liter four-neck flask equipped with a mechanical agitator, a condenser, a dropping funnel, and a nitrogen inlet tube. To the solution was added 480.3 g of an aqueous nitric acid solution (1,000 ppm) at room temperature. After the mixture was allowed to react at 50° C. for 1 hour, methanol and ethanol were removed from the reaction mixture under reduced pressure. The reaction was continued for 1 day while maintaining the reaction temperature at 50° C., yielding the silicone polymer represented by Formula 14:
$\{(SiO_{1.5}-CH_2CH_2-SiO_{1.5})_{0.50}(MeSiO_{1.5})_{0.040}(PhSiO_{1.5})_{0.10}\}(OH)_{0.18}(OMe)_{0.04}(OEt)_{0.03}$ (14) (wherein Me, Et, and Ph represent methyl, ethyl, and phenyl, respectively).

2.0 g of the polymer was diluted with 50 g of PGMEA and 0.002 g of pyridinium p-toluenesulfonate was added thereto. The resulting solution was spin-coated on a silicon wafer, followed by baking at 240° C. for 60 seconds to form a 500 Å thick film.

Experimental Example 1

The films formed in Examples 1-3 were measured for contact angle with water using a contact angle measurement system (Phoenix 300 plus, SEQ). 10 μl of water was dropped onto the surface (five points) of each of the films. The angles between the surface of the film and the drops of water were measured. The results are shown in Table 1.

TABLE 1

| Contact angle | Point 1 (°) | Point 2 (°) | Point 3 (°) | Point 4 (°) | Point 5 (°) | Average (°) |
|---|---|---|---|---|---|---|
| Example 1 | 79.2 | 79.1 | 79.4 | 79.5 | 79.0 | 79.2 |
| Example 2 | 73.8 | 73.6 | 73.6 | 73.6 | 73.7 | 73.7 |
| Example 3 | 71.5 | 71.2 | 72.3 | 71.3 | 71.1 | 71.5 |

The results shown in Table 1 demonstrate that polymers having desired surface characteristics may be readily synthesized by appropriately varying the feeding ratio of the compounds represented by Formulae 5-7. Particularly, as the proportion of the compound represented by Formula 7 in the polymers increased, the surface characteristics of the polymers were more hydrophilic.

Experimental Example 2

The films formed in Examples 1 and 4 were measured for refractive index (n) and extinction coefficient (k) using an ellipsometer (J. A. Woollam). The results are shown in Table 2.

TABLE 2

| Sample used for film formation | Optical properties (193 nm) | |
|---|---|---|
| | Refractive index (n) | Extinction coefficient (k) |
| Example 1 | 1.62 | 0.10 |
| Example 4 | 1.73 | 0.20 |

As can be seen from the results of Table 2, taking advantage of the ability of the substituted or unsubstituted aromatic groups included in the polymers to absorb UV light in the deep UV (DUV) region, materials with excellent antireflective properties may be produced and the antireflective properties of the materials may be optimized by varying the contents of the compounds used.

Experimental Example 3

The solutions prepared in Examples 5-7 were tested for stability. The three solutions were stored at 40° C. for 30 days. The states of the solutions were observed and the thicknesses of the films after coating were measured. The results are shown in Table 3.

TABLE 3

| Sample | Before storage | | 30 days after storage | |
|---|---|---|---|---|
| | Normalized molecular weight | Thickness (Å) | Normalized molecular weight | Thickness (Å) |
| Example 5 | 1.0 | 501 | 1.0 | 503 |
| Example 6 | 1.0 | 502 | 1.0 | 503 |
| Example 7 | 1.0 | 503 | 1.0 | 514 |

The normalized molecular weight refers to a value obtained by dividing the molecular weight of the corresponding polymer measured after 30 days of storage by the molecular weight of the polymer measured immediately after the preparation of the polymer. The results in Table 3 show that the polymers having alkoxy (—OR) groups in the predetermined content range defined in the present embodiment were highly stable during storage. The more the amount of alkoxy groups, the less the changes in molecular weight and thickness after storage for the given time, indicating better storage stability. These results lead to the conclusion that the storage stability of the solutions may be improved by varying the amount of alkoxy groups remaining after hydrolysis.

Experimental Example 4

An ArF photoresist was coated on each of the films formed in Examples 1-3, baked at 110° C. for 60 seconds, exposed to light using an ArF exposure system (ASML1250, FN70 5.0 active, NA 0.82), and developed with an aqueous solution of TMAH (2.38 wt %) to form an 80-nm line and space pattern. The exposure latitude (EL) margin of the pattern was measured as a function of exposure energy and the depth of focus (DoF) margin of the pattern was measured as a function of the distance from a light source. The results are recorded in Table 4.

TABLE 4

| Sample used for film formation | Pattern properties | |
|---|---|---|
| | EL (Δ mJ/exposure energy mJ) | DoF (μm) |
| Example 1 | 0.2 | 0.2 |
| Example 2 | 0.2 | 0.2 |
| Example 3 | 0.2 | 0.2 |

The patterns all showed good photo profiles in terms of EL margin and DoF margin. The results demonstrate that the silicon-based spin-on hardmask compositions may be practical for use in semiconductor manufacturing processes.

Experimental Example 5

The patterned specimens obtained in Experimental Example 4 were sequentially dry-etched using $CF_x$ plasma, $O_2$ plasma and $CF_x$ plasma. The remaining organic materials were completely removed using $O_2$, and the cross sections of the etched specimens were observed by FE-SEM. The results are listed in Table 5.

TABLE 5

| Sample for film formation | Pattern shape after etching |
|---|---|
| Example 1 | Vertical |
| Example 2 | Vertical |
| Example 3 | Vertical |

The patterns had vertical shapes after etching, indicating good etching characteristics of the specimens. The results reveal that the silicon-based spin-on hardmask compositions can be actually used in semiconductor manufacturing processes.

Figure 1:
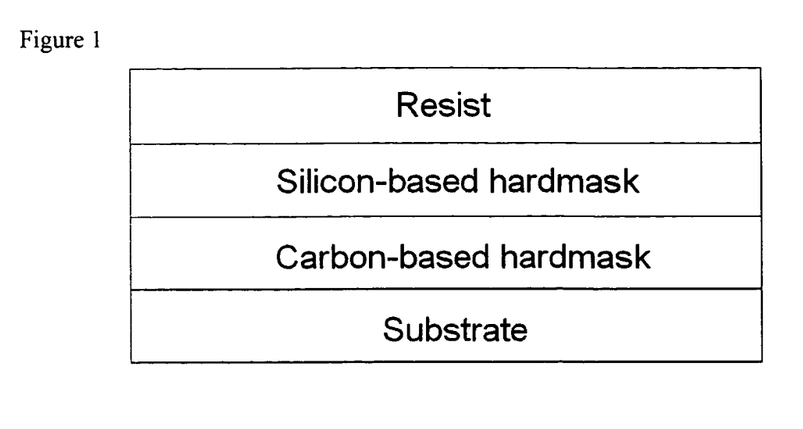
FIG. 1 illustrates a schematic cross-sectional view of a multilayer film of a carbon-based hardmask, a silicon-based hardmask, and a resist on a substrate.

In general, hardmasks are materials featuring high etch selectivity. A typical hardmask may have two layers (see FIG. 1). Referring to FIG. 1, a carbon-based hardmask and a silicon-based hardmask may be sequentially formed on a substrate, and a photoresist may be coated on the silicon-based hardmask. Although the thickness of the photoresist may be very small, a pattern of the thin photoresist may be easily transferred to the silicon-based hardmask because of higher etch selectivity of the silicon-based hardmask for the photoresist than for the substrate. Etching of the carbon-based hardmask may be performed using the patterned silicon-based hardmask as a mask to transfer the pattern to the carbon-based hardmask. Finally, etching of the substrate may be performed using the patterned carbon-based hardmask as a mask to transfer the pattern to the substrate. Consequently, the substrate may be etched to a desired thickness despite the use of the thin photoresist.

In the past, hardmasks have been produced by chemical vapor deposition (CVD) in semiconductor manufacturing processes on an industrial scale. However, the formation of particles may result during CVD. Such particles may be embedded in hardmasks, making it difficult to detect. The presence of particles may be insignificant in a pattern with a large line width. However, even a small amount of particles may greatly affect the electrical properties of a final device with decreasing line width, causing difficulties in the mass production of the device. Further, CVD may require a long time and expensive equipment to produce hardmasks.

In contrast, embodiments may provide hardmask materials that can be applied by spin-on coating. Spin-on coating may be advantageous in that it is easy to control against the formation of particles, the processing time is short, and existing coaters can be used, incurring no substantial additional investment costs. A silicon-based hardmask material according to an embodiment described herein may provide a sufficiently high silicon content in terms of etch selectivity. An excessively high silicon content may cause poor coatability and storage instability of the hardmask material, and it may be difficult to optimize silicon content for mass production of hardmasks. A failure in controlling the surface physical properties of the material may result in defects during coating with another material. However, according to embodiments, such characteristics may be controlled to produce hardmasks having characteristics desirable for device manufacturing.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A silicon-based hardmask composition, comprising:
an organosilane polymer represented by Formula 1:

wherein:
x, y, and z satisfy the relations $0.05 \leq x \leq 0.9$, $0.05 \leq y \leq 0.9$, $0 \leq z \leq 0.9$, and $x+y+z=1$,
e and f represent the ratios of the numbers of terminal —OH groups and —OR$_6$ groups bonded to the silicon atoms to the number of $2x+y+z$ silicon atoms in the organosilane polymer, respectively, and satisfy the relations $0.03 \leq e \leq 0.2$ and $0.03 \leq f \leq 0.25$,
X is a $C_6$-$C_{30}$ group containing at least one substituted or unsubstituted aromatic ring,
R$_3$ is a $C_1$-$C_{12}$ alkyl group,
Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond, and
R$_6$ is a $C_1$-$C_6$ alkyl group.

2. The hardmask composition as claimed in claim 1, wherein the organosilane polymer is a polycondensate of compounds represented by Formulae 2, 3, and 4:

$$(HO)_a(R_1O)_{(3-a)}Si-X \qquad (2)$$

wherein R$_1$ is a $C_1$-$C_6$ alkyl group, $0 \leq a \leq 3$, and X is a $C_6$-$C_{30}$ group containing at least one substituted or unsubstituted aromatic ring;

$$(HO)_b(R_2O)_{(3-b)}Si-R_3 \qquad (3)$$

wherein R$_2$ is a $C_1$-$C_6$ alkyl group, $0 \leq b \leq 3$, and R$_3$ is a $C_1$-$C_{12}$ alkyl group; and $$(HO)_c(R_4O)_{(3-c)}Si-Y-Si(OH)_d(R_5O)_{(3-d)} \qquad (4)$$

wherein R$_4$ and R$_5$ are independently a $C_1$-$C_6$ alkyl group, $0 \leq c \leq 3$, $0 \leq d \leq 3$, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone, and a $C_2$-$C_{20}$ hydrocarbon group containing at least one multiple bond.

3. The hardmask composition as claimed in claim 1, wherein the organosilane polymer has a weight average molecular weight of about 2,000 to about 90,000.

4. The hardmask composition as claimed in claim 1, wherein the organosilane polymer is prepared by polycondensation, in the presence of an acid catalyst, of hydrolysates of compounds represented by Formulae 5, 6, and 7:

$$(R_1O)_3Si-X \qquad (5)$$

wherein X is a $C_6$-$C_{30}$ group containing at least one substituted or unsubstituted aromatic ring, and R$_1$ is a $C_1$-$C_6$ alkyl group;

$$(R_2O)_3Si-R_3 \qquad (6)$$

wherein R$_2$ is a $C_1$-$C_6$ alkyl group and R$_3$ is a $C_1$-$C_{12}$ alkyl group; and $$(R_4O)_3Si-Y-Si(OR_5)_3 \qquad (7)$$

wherein R$_4$ and R$_5$ are independently a $C_1$-$C_6$ alkyl group, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone and a $C_2$-$C_{20}$ hydrocarbon group containing at least one multiple bond.

5. The hardmask composition as claimed in claim 4, wherein the organosilane polymer is prepared by mixing up to about 90 parts by weight of the compound represented by Formula 5, about 5 to about 90 parts by weight of the compound represented by Formula 6, and about 5 to about 90 parts by weight of the compound represented by Formula 7 with respect to 100 parts by weight of the compounds represented by Formulae 5, 6, and 7, and allowing the mixture to react in the presence of about 0.001 to about 5 parts by weight of an acid catalyst.

6. The hardmask composition as claimed in claim 4, wherein the acid catalyst is selected from the group of nitric acid, sulfuric acid, hydrochloric acid, p-toluenesulfonic acid monohydrate, diethyl sulfate, and combinations thereof.

7. The hardmask composition as claimed in claim 1, wherein the organosilane polymer is prepared by polycondensation of hydrolysates of compounds represented by Formulae 6 and 7:

$$(R_2O)_3Si-R_3 \qquad (6)$$

wherein R$_2$ is a $C_1$-$C_6$ alkyl group and R$_3$ is a $C_1$-$C_{12}$ alkyl group; and $$(R_4O)_3Si-Y-Si(OR_5)_3 \qquad (7)$$

wherein R$_4$ and R$_5$ are independently a $C_1$-$C_6$ alkyl group, and Y is a linking group selected from the group of an aromatic ring, a substituted or unsubstituted linear or branched $C_1$-$C_{20}$ alkylene group, a $C_1$-$C_{20}$ alkylene group containing at least one aromatic or heterocyclic ring or having at least one urea or isocyanurate group in the backbone and a $C_2$-$C_{20}$ hydrocarbon group containing at least one multiple bond, in the presence of an acid catalyst.

8. The hardmask composition as claimed in claim 1, wherein:
the hardmask composition further comprises a solvent, and
the organosilane polymer is present in an amount of about 1 to about 50 parts by weight, based on 100 parts by weight of the hardmask composition.

9. The hardmask composition as claimed in claim 1, further comprising at least one additive selected from the group of crosslinkers, radical stabilizers, and surfactants.

10. The hardmask composition as claimed in claim 1, further comprising at least one compound selected from the group of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, tetrabutylammonium nitrate, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluenesulfonate, and tetrabutylammonium phosphate.

11. The hardmask composition as claimed in claim 10, further comprising at least one additive selected from the group of crosslinkers, radical stabilizers, and surfactants.

12. The hardmask composition as claimed in claim 1, wherein the organosilane polymer represented by Formula 1 is represented by the following Formula 1A:

(1A), wherein f1 and f2 satisfy the relation f1+f2=f.

13. A process for producing a semiconductor integrated circuit device, the process comprising:
    forming a carbon-based hardmask layer on a substrate;
    coating the hardmask composition according to claim 1 on the carbon-based hardmask layer to form a silicon-based hardmask layer;
    patterning a photoresist layer on the silicon-based hardmask layer to form a pattern;
    transferring the pattern to the silicon-based hardmask layer using the patterned photoresist layer as an etch mask to pattern the silicon-based hardmask layer;
    transferring the pattern to the carbon-based hardmask layer using the patterned silicon-based hardmask layer as an etch mask to pattern the carbon-based hardmask layer; and
    transferring the pattern to the substrate using the patterned carbon-based hardmask layer as an etch mask.

14. The process as claimed in claim 13, further comprising forming an antireflective coating on the silicon-based hardmask layer prior to forming the photoresist layer on the silicon-based hardmask layer.

15. The process as claimed in claim 13, wherein coating the hardmask composition is performed using a spin-on process.

* * * * *